United States Patent
Hoenig et al.

(10) Patent No.: US 6,618,681 B2
(45) Date of Patent: Sep. 9, 2003

(54) METHOD AND APPARATUS FOR PREDICTING THE AVAILABLE ENERGY OF A BATTERY

(75) Inventors: Steven Hoenig, Staten Island, NY (US); Harmohan Singh, Rockaway, NJ (US); Thirumalai G. Palanisamy, Morristown, NJ (US); Margaret Eagan, Boonton Township, NJ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/847,823

(22) Filed: May 2, 2001

(65) Prior Publication Data

US 2002/0193953 A1 Dec. 19, 2002

(51) Int. Cl.$^7$ ............................................. G06F 19/00
(52) U.S. Cl. ............................ 702/63; 702/31; 702/63; 702/85; 702/182; 320/127; 320/130; 320/136; 324/426; 324/430; 324/433; 700/52; 700/89; 700/108; 307/18; 307/24; 307/46
(58) Field of Search ................................ 702/31–32, 57, 702/60, 63–65, 85, 86, 108, 117, 127, 182; 320/127, 130–136, 147, 148, 153, FOR 101, 103, 108, 121–133; 324/426, 430, 433, 600, 601, 605, 608, 691, 713, 720, 721; 700/52, 89, 91, 108, 291, 293, 295, 297, 299, 286; 307/18–21, 24, 31, 46, 48; 429/61, 62, 63, 121, 123, 125, 126

(56) References Cited

U.S. PATENT DOCUMENTS

| 4,745,349 | A | * | 10/1986 | Palanisamy et al. | .......... 320/22 |
| 6,411,911 | B1 | * | 6/1992 | Hirsch et al. | .................. 702/63 |
| 5,281,919 | A | | 1/1994 | Palanisamy | |
| 5,642,100 | A | * | 9/1995 | Farmer | ........................ 340/636 |
| 6,137,292 | A | * | 5/1999 | Hirsch et al. | ................ 324/427 |
| 6,215,312 | B1 | | 4/2001 | Hoening et al. | |

* cited by examiner

Primary Examiner—Marc S. Hoff
Assistant Examiner—Elias Desta

(57) ABSTRACT

A method of predicting by non-invasive testing the available energy of a battery at any state of charge by acquiring data of the parameters of internal resistance (IR), open circuit voltage (OCV) and temperature (T), the points of voltage and current of the slope on a positive current ramp of $V_{up}$ and $I_{up}$ at the transition from charge to overcharge and on a negative current ramp of $V_{dn}$ and $I_{dn}$ at the transition from overcharge to charge for a plurality of batteries. Next an algorithm in the form of a linear equation is developed using this data. The available energy of a battery under test is predicted by acquiring from it the numerical data values of these parameters and applying them to the algorithm.

10 Claims, 3 Drawing Sheets

METHOD AND APPARATUS FOR PREDICTING THE AVAILABLE ENERGY OF A BATTERY

FIELD OF THE INVENTION

The invention relates to a method and apparatus for predicting the available energy of a battery and the available run time for such a battery at any state of charge by use of a non-invasive test procedure.

BACKGROUND OF THE INVENTION

It is often desired to determine the actual capacity of a battery, usually measured in amp hours (Ah), and particularly a lead-acid storage type. Conventional methods for determining the capacity of a lead-acid storage battery involve fully charging the battery to 100% state of charge (SOC) and then fully discharging the battery at a constant current (amperes) value. The battery capacity is determined by multiplying the discharge current value (in amperes) times the discharge time (in hours) needed to fully discharge the battery.

Following the discharge to determine its capacity, the battery must be fully charged again to be ready for use. As seen, this method involves a significant amount of charging and discharging and is time consuming since it takes a relatively long time for each of the charge and discharge cycles. The cycling method also may be destructive of the battery health. For example, in a lead-acid storage battery, gassing may occur in overcharging the battery, and cause damage. Also, there is wear of the battery due to the charge/discharge cycling.

The foregoing test basically provides an analysis of the static condition of a battery and is not a measure of its future performance. It also is often important to be able to predict the available energy that a battery can deliver when at a given condition of charge, e.g., when fully charged (100% SOC) or at less than 100% SOC. The available energy of a battery is different from its rated capacity. Battery capacity is the maximum amount of energy that can be stored and retrieved from the battery. Available energy is a function of the battery SOC. That is, the battery capacity is assumed to be that as rated by the manufacturer or the value determined most recently by actual discharge testing as described above. Battery rated capacity is the same at all states of charge. But a battery can be at various states of charge (SOC) from 0% to 100%. The battery rated capacity (Ah) times the state of charge (SOC) determines the available energy that can be delivered by the battery. Thus, it is apparent that actual available energy decreases with decreasing states of charge.

Being able to predict the available energy can be important, for example, in a mission critical application, such as an uninterruptible power source (UPS), since this determines the time that the source battery can perform its function. This is sometimes called battery "run time", which is the time that the battery can operate in its application at a given current drain based on the available energy until full discharge. This is calculated based on the available energy of the battery at its present SOC and the discharge current of the application.

As should be apparent, maintenance personnel and time are required to test a battery using the prior art charge/discharge cycling method described above for determining battery actual capacity. Also, to do this, a battery has to be taken off line for testing, during which time the battery is not available for its designated application, such as in an UPS.

Another method for determining battery capacity has been developed by the assignee of this application, as described in U.S. Pat. No. 5,049,803. That method determines battery actual capacity through active testing of a fully charged (100% SOC) battery without requiring that the battery be discharged. This test is significantly faster than the conventional discharge-charge cycling described above, and has no harmful effect on the battery and its performance. If the battery actual capacity, i.e., available energy, is known, the run time can be calculated if the rate of current discharge of the application is known. However, the method described in this patent is limited in application to batteries in a fully charged state, i.e., 100% SOC.

Accordingly, a need exists for predicting the available energy of a battery over a range of SOC values without having to perform the charge/discharge cycling or to fully charge the battery. If the available energy is known, the run time of the battery, that is, the time that the battery can successfully operate in its application, can be computed.

BRIEF DESCRIPTION OF THE INVENTION

The present invention is directed to a method for predicting the available energy of a battery independent of its state of charge (SOC) without having to discharge the battery and from this to determine run time. In a preferred embodiment of the invention, the system includes a programmable computer that controls the testing.

In accordance with the invention, a prediction algorithm in equation form is first developed by testing a battery to acquire data of various battery parameters such as its internal resistance (IR), operating temperature (T), open circuit voltage (OCV) and gas point voltage responses to both a charging and a discharging current. The values of these parameters are subjected to mathematical analysis to develop the algorithm equation that has various numerical weighting factors for the parameters. The equation also can include a numerical offset value.

To predict the available energy of a battery being tested, the battery is tested to acquire data of the parameters. To obtain the value of IR, a charging current pulse is applied and battery internal resistance (IR) is determined based on the voltage response. The OCV and T are measured directly. A ramp current is applied to the battery and the voltage response to the ramp is monitored, and from this data the parameters of the gas points of battery charge and discharge are determined. The values of the acquired parameters of the battery are applied to the equation and the solution is the predicted available energy. All of the acquisition of the parameter data values and prediction of the available energy is accomplished under control of a computer and is done on a non-invasive basis, i.e., there is no need to access the battery structure such as to measure the electrolyte. Also, the testing and prediction are accomplished in a rapid manner.

Available energy of the battery can be predicted at various states of charge (SOC) and is not dependent on whether the battery is fully charged. The invention has been successfully developed and tested for lead-acid batteries having capacities over the range of 2 Ah to 25 Ah and is applicable to batteries of various ranges of capacities.

OBJECTS OF THE INVENTION

It is therefore an object of the invention to provide a method to predict the available energy of a battery.

Another object is to provide a method to predict the available energy of a battery over a range of battery SOC without having to discharge the battery or perform invasive testing.

Yet a further object is to provide a method to predict the available energy of a lead-acid storage battery by subjecting it to pulse and ramp type current testing and measuring various parameters.

Another object of the invention is to provide a method to predict the available energy of a battery by non-invasive testing.

BRIEF DESCRIPTION OF THE DRAWINGS

Other objects and advantages of the present invention will become more apparent upon reference to the following specification and annexed drawings in which.

DETAILED DESCRIPTION OF THE INVENTION

Figure 1:
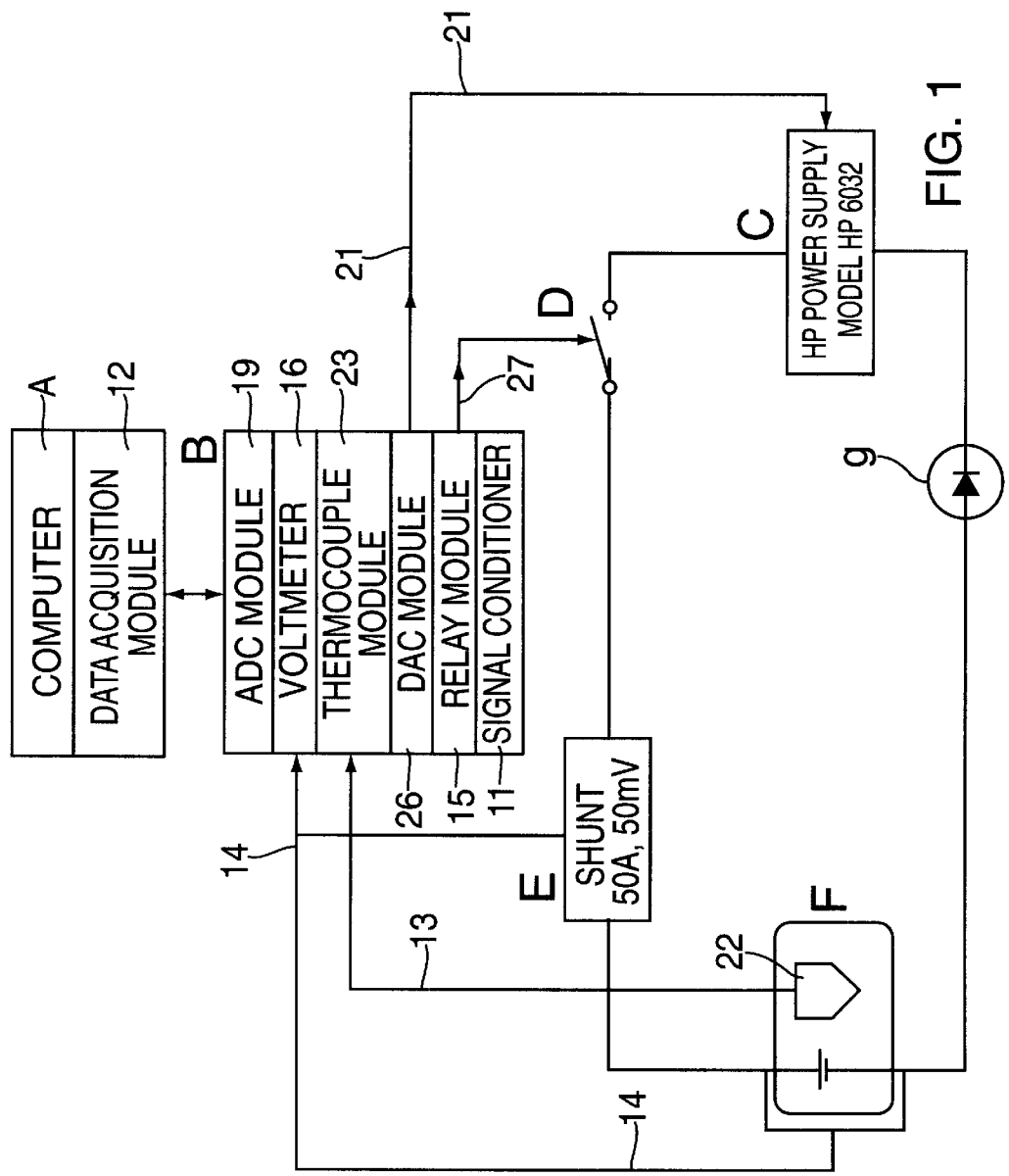
FIG. 1 is a schematic diagram of the circuit for carrying out the invention.

The battery to be tested is attached to a charging and monitoring system. The system can be a standalone unit or one of separate components. Each version of the system includes a power supply, computer, data acquisition system and/or a voltmeter. There are many configurations that can effectively form the system and a typical configuration is shown in FIG. 1. While the method and system are illustratively described with reference to a lead-acid storage battery, they have application to other types of batteries, such as NiCd, AgZn, NiMH and Li-Ion.

In FIG. 1 there is a computer A of any suitable conventional microprocessor or microcontroller type that includes a data input device, e.g., a keyboard (not shown), and output device, e.g., a printer and/or display (not shown). The computer A includes an application program having the necessary instructions to control the charging and discharging of the battery and to perform various measurement, calculation and diagnostic functions, as described below. The application program can be embedded in a read only memory (ROM) or in a suitable device such as a PROM that can be reprogrammed. The computer A also includes the usual RAM type memory, data processing unit and computational facilities. It also has its own internal clock that interfaces with the application program. The computer is also shown as having a data acquisition module (DAQ)-12 which inputs the data from various sources as described below.

Charging current is supplied to the battery F being tested from a programmable variable current (power supply) source C whose output is controllable by analog voltage signals over line 21 from a digital to analog converter (DAC)-11 associated with computer A. That is, the computer application program produces the signals to control the current source. The current source C can be any conventional type that is controllable by computer A to have a variable output. For example, for source C, a Hewlett Packard Model HP 6032A can be used.

The current path from source C to one of the battery F terminals, here shown as the positive one, is through a relay D that also is under control of the computer A as discussed below. The battery current supply circuit also includes a protective diode G in series between the common output of current source C and the negative terminal of the battery to protect the source C from any reverse current from the battery. The reverse polarity connections can be used, if desired.

Reference character B indicates a signal conditioning system unit such as a National Instrument having a data input portion and a control portion and is connected to the computer A for bi-directional communication. Unit B includes a relay control module 15 to provide the signals originating from the computer over line 77 to control opening and closure of the contact of relay D. Unit B also includes a voltmeter 16 whose input leads 14 are connected across the battery positive and negative terminals to measure its voltage during charging, discharging, and open circuit (no charge or discharge) conditions. Unit B also receives temperature data over line 13 from a thermocouple 12 that is placed at any suitable location, such as on the case of battery F.

Current in the battery charge/discharge circuit is measured under control of Unit B by measuring the voltage across a shunt E. Any other suitable technique can be used to measure the current, for example, a Hall effect device. The measured voltage, current and temperature, each an analog quantity, are converted to digital form by an analog-digital converter (ADC) module 29 in unit B and the digital data of these parameters is supplied to computer A.

Unit B thus includes a digital to analog converter (DAC)-11 to produce analog control signals from the digital signals supplied by the computer A as directed by its application program. The digital-to-analog converter in the control portion of unit B responds to digital output signals from computer A to produce the analog signal on line 21 to control the current source C output. As described below, the source C is operated to produce current output of a pulse and a varying ramp type flow that increases and decreases between two values.

Unit B controls relay D by applying a contact closure control signal over line 17 to switch the battery in and out of the charging circuit. During charging and analysis of the battery F, the relay D is closed. When relay D is open, the battery F is taken out of the circuit, that is, no charge can be applied. At this time, the battery open circuit voltage can be measured.

The method and system for performing the diagnostic of the battery is under control the application program of computer A to automatically perform the entire diagnostic testing of a battery F through the use of the computer A and data acquisition and output control portions of unit B. The computer controls the entire charging and diagnostic testing of the battery. The operation of the system and method of analysis is described below.

In using the invention, the first step is to develop an algorithm in equation form whose solution is the available energy of a battery. After this is done, the second step is to acquire data of various parameter values of a battery under test and to apply these values to the equation. Both steps use a common analysis, as described below.

Before starting the analysis for either step, safe voltage and current limits are established from the known battery characteristics. This information typically is provided by the battery manufacturer. That is, the battery voltage and supplied current are adjusted, preferably made fail safe, so that the voltage and current limits are not exceeded.

The analysis cycle comprises two separate stages. It is described with respect to developing the algorithm but is also used in acquiring data values for a battery being tested.

Stage 1

During this stage, as directed by computer A, a step or pulse charge current is applied from the power supply C to the battery F and the battery response voltage is measured by the voltmeter 14. The measured voltage is converted to digital form and the data stored in the computer memory. The current is also measured by measuring the voltage across the shunt E, and this data also is stored. The voltmeter can be multiplexed to alternately measure voltage and current.

The current pulse applied to the battery from source C is started from 0 Amps and increases, preferably as fast as the power supply is capable, to a predetermined level, for example, 1.5 Amps. The current is maintained at that amplitude for a predetermined time, for example, 2 seconds, after which it returns substantially instantaneously to 0 Amps. The voltage and current are continuously measured during application of the pulse, and this data is stored in computer memory.

Using the stored measured voltage (V) and current (I) parameter data, the internal resistance (IR) of the battery is computed by the computer. The IR is defined as the dV/dI during the rising portion of the current pulse. The computer A calculates dV/dI using the acquired measurement data. For example, this can be the value of each of the voltage and current at the beginning, 0 amp value, and end, 1.5 amp value, of the current pulse. The calculated internal resistance value parameter is stored until needed in Stage 2.

Stage 2

Before the application of this stage, the battery open circuit voltage (OCV) and temperature (T) are measured and this data is stored. The computer A application programs opens the relay D to permit the OCV measurement by the voltmeter 14. The temperature T is acquired from the thermocouple 22. Both of these measurements yield analog data that is converted to digital form by the DAC 11.

During this stage of the test, as directed by the computer, a linearly increasing charge current from source C is applied to the battery, and the battery response voltage is measured and the data stored in computer memory. The current begins at 0 Amps and increases linearly until either the ramp current reaches a predetermined current level, for example 5 Amps, or the battery voltage reaches a pre-set limit, for example 2.5V multiplied by the number of battery cells connected in series.

The rate at which the current is increased is selected based on the desired test time, desired accuracy, resolution and the battery's rated capacity. For example, a slope of 0.033 Amps/sec has been found to be a reasonable value for lead-acid batteries having a rated capacity up to 25 Ah. While a linear current increase is preferred, the increase does not have to be linear, as long as it is monotonously increasing.

After the maximum current point of the positive ramp has been reached, the current is then decreased with the same, but negative value slope until it reaches 0 Amps. Battery voltage is continually measured and the digital data is stored in computer memory throughout the test.

Figure 2:
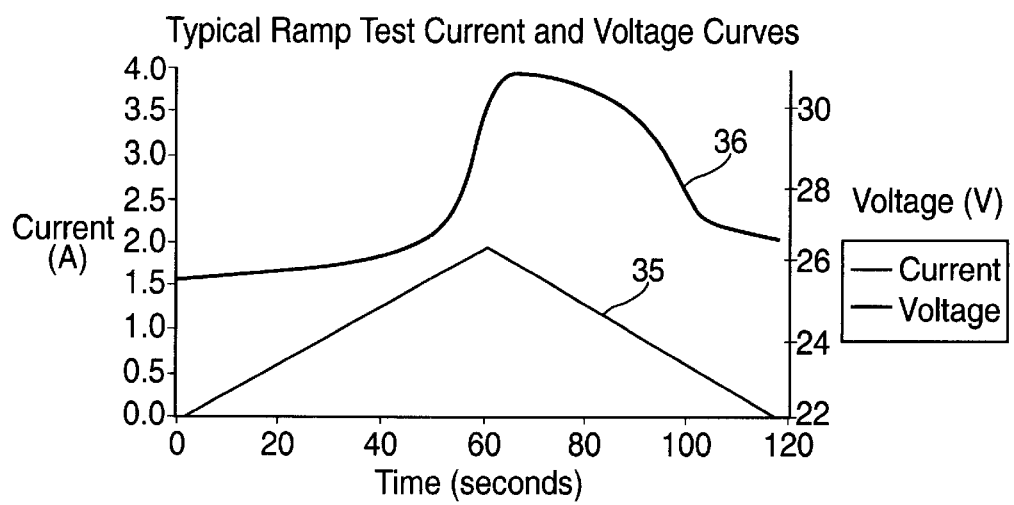
FIG. 2 is a graph showing the current and voltage response of a ramp test.

FIG. 2 shows a typical current ramp test cycle and the voltage response. As seen in FIG. 2, the current I (line 35) is applied as a ramp that first increases and then decreases. The time is shown on the graph horizontal axis and the current value on the left vertical axis. The voltage V measured across the battery terminal in response to this current waveform is shown by the data line 36 and the voltage value on the right vertical axis.

Figure 3:
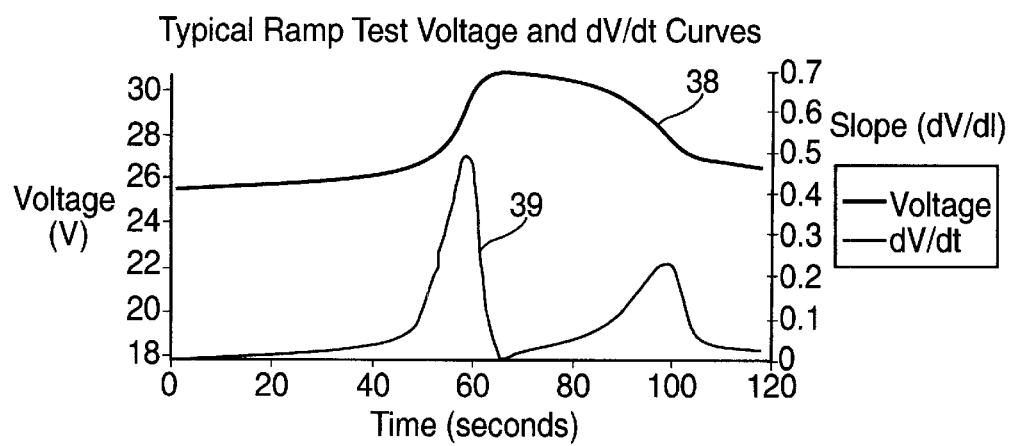
FIG. 3 is a graph showing the dV/dt of the applied current and voltage response of FIG. 2.

The slope of the voltage response curve (dV/dt) is calculated by the computer A from the measured voltage data in response to the applied positive and negative current ramps. FIG. 3 indicates the voltage slope calculated for the voltage response of FIG. 2. FIG. 3 also shows the voltage curve (line 38). The slope value (line 39) is produced by the computer that continuously calculates dV/dt over the duration of the current ramps. The voltage value is on the graph left vertical axis and the slope value on the right vertical axis. Determination of the slope of the voltage curve (dV/dt) is accomplished by the computer calculating from its stored data the difference in successive voltage values over a small time interval. The number of calculations made is selected as needed. A greater number of calculations increases the resolution (accuracy), but also requires an increase in computer processing speed and memory capacity.

When the slope goes through a maximum, it indicates the transition in the battery from charge reaction to overcharge reaction in the up ramp applied current and from overcharge reaction to charge reaction in the down ramp applied current. In aqueous batteries, such as of the lead-acid type, the overcharge reaction is hydrogen and oxygen gas evolution. The computer A determines the points of maximum slope value. The current and voltage levels at which this occurs are hereafter referred to respectively as the gas current ($I_{gas}$), and gas voltage ($V_{gas}$).

A typical battery response to this test cycle exhibits a dV/dt maximum on both the increasing and decreasing portions of the applied current ramps. The current and voltage values corresponding to the transition point on the increasing portion of the ramp are referred to as $I_{up}$ and $V_{up}$, while the corresponding values on the decreasing portion of the ramp are referred to as $I_{dn}$ and $V_{dn}$. The values of the current and voltage parameters at which the gas points occur are calculated and then stored by the computer.

The calculated slope data preferably is subjected to an averaging process. In a preferred embodiment, a seven point averaging technique has been found to sufficiently eliminate noise caused by the electronic circuitry. Using fewer points for averaging may result in insufficient noise suppression, while including more points may suppress the sharpness of the dV/dt data.

It has been found that each of the above described measured parameters OCV and T and calculated parameters $I_{up}$, $V_{up}$, $I_{dn}$, $V_{dn}$ and IR, proportionally reflect the value of the battery available energy. The combination of each of these seven parameters used in an algorithm (equation) including appropriate weighting of its terms has been found to correlate accurately with a prediction of battery available energy. The numerical values of the seven parameters obtained for a battery as described above are used as inputs to develop an energy prediction algorithm.

To develop the algorithm, a number of batteries are cycled through the tests described above to acquire data from each one for the seven parameters. An algorithm can be developed for batteries of only one size, for example, a rated capacity of 5 Ah, or over a broader range, for example from 5 Ah to 20 Ah. In the latter case, sets of tests are made on different sizes of batteries within the range, for example, 5 Ah, 10 Ah and 20 Ah. The data points acquired for each of the tested batteries is plotted. The results of the different tests are not averaged. Data that appears to be aberent is discarded. The algorithm is determined from this data, for example, by using a linear estimation algorithm, such as found in the Microsoft Excel software program. Other similar techniques can be used. The algorithm produces a linear type equation whose general form is shown in equation (1).

$$\text{Available energy} = OCV^*(a) + T^*(b) + IR^*(c) + I_{up}^*(d) + V_{up}^*(e) + I_{dn}^*(f) + V_{dn}^*(g) + (h) \quad (1)$$

where each of (a), (b), (c), (d), (e), (g), and (h) is a numerical value.

Table 1 shows the resulting weightings of the seven input parameters, and an offset for the equation for one battery size and type. The term size here refers to the 2–25 Ah range and the type refers to the battery structure (i.e., plate construction, electrolyte, gel, etc.).

| PARAMETER | WEIGHT |
| --- | --- |
| OCV | 1.872 |
| TEMPERATURE (T) | −0.184 |
| IR | −0.062 |
| $I_{up}$ | 1.415 |
| $V_{up}$ | −0.485 |
| $I_{dn}$ | −1.632 |
| $V_{dn}$ | 0.55 |
| Offset | −36.13 |

For this range of batteries the following available energy prediction equation results from the above weightings:

$$\text{Available energy} = OCV^*(1.872) + T^*(-0.184) + IR^*(-0.062) + I_{up}^*(1.415 + V_{up}^*(0.485) + I_{dn}^*(1.632) + V_{dn}^*(0.5498) + (36.13)$$

To predict the available energy of a battery being tested whose actual rated capacity is within the range for which the algorithm was developed, the numerical values of the seven parameters are determined for the battery as described above for Stage 1 and Stage 2 testing. These values are then inserted into equation (2) to predict available energy for the battery. The solution to equation (2) is automatically calculated by the computer based on the values of the seven parameters it acquires and stores in computer memory. The computed available energy prediction can be presented in terms Ah on a suitable display device driven by the computer A. The discharge rate also can be displayed.

Figure 4:
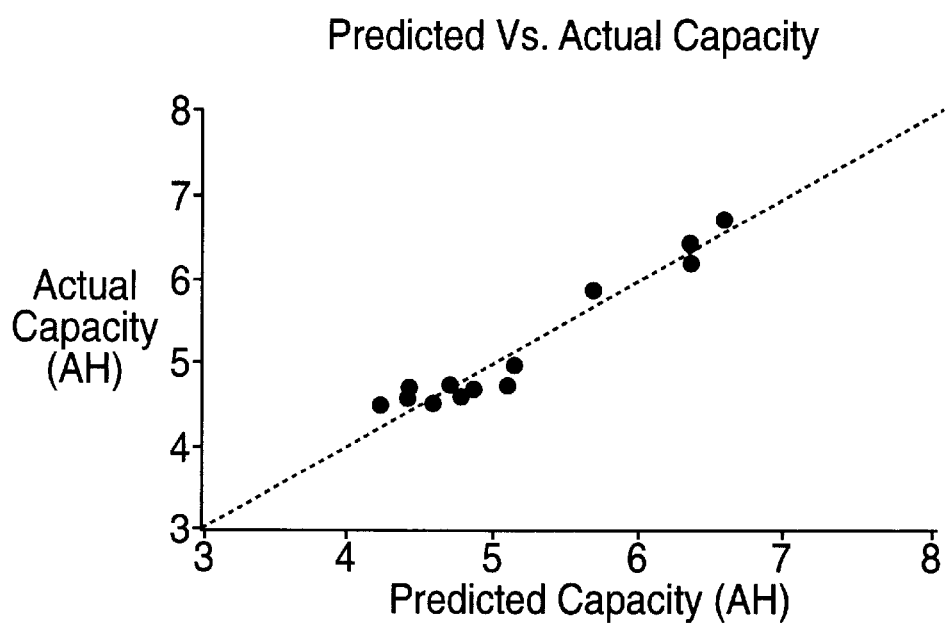
FIG. 4 is a graph showing a comparison of predicted battery capacity and actual measured capacity.

The accuracy of the prediction equation has been tested. FIG. 4 is a graph of the solution of equation (2), the calculated or predicted available energy, plotted against the actual amount (actual capacity) of energy as measured by actual discharge testing for a number of sample tests, this illustratively being thirteen. The left vertical line designates actual measured battery capacity. Actual available energy was confirmed through a constant current discharge at a 2 C (twice the battery nominal rated capacity) rate. Discharge capacity results are therefore lower than rated. The data points (dots) are the results of predicting for each test the available energy based on the determination of the numerical values of the seven parameters and the application of equation (1). The resulting data points are plotted against the actual capacity measured by the discharge testing. Result errors (departure from the dotted line) versus actual averaged less than 4% error. This confirms the accuracy of the prediction method.

The linear estimation represented by equation (2) is optimized for the range of battery rated capacity of 2–25 Ah. It might not be as accurate for larger rated capacity batteries. One general equation can be developed involving one or more of the above parameters by experimenting with batteries of all sizes and conditions in the desired overall range and selecting the algorithm that shows the best prediction accuracy over this range.

While one algorithm can be developed to match a large range of battery sizes, this single algorithm will not be as accurate as several more finely tuned ones. That is, for better accuracy, a separate equation involving the seven parameters is generally advisable for batteries of several different ranges of rated capacity. For example, there can be an equation for batteries of the 2–25 Ah range, another for batteries from 25–50 Ah range, a third for the 50–100 Ah range, etc. An algorithm can be developed for each different capacity range using the procedure described above.

It is possible for the ramp test to be performed using different test parameters, e.g., ramp slope. However, it is important to note that a different calibration curve, such as corresponding to equation (1), specific to that slope must be generated and used for testing. Parameters can only be changed to a certain degree. In addition, due to the non-linearity of the ramp test response, changes in parameters will not have a proportional effect on changes in the test response and calibration curve results. Basically, it is not expected to have linear effects on parameter changes. For instance, if the voltage limits are raised by 10%, this does not cause every parameter to adjust by some factor of that. The weight of OCV may change 5% while the weight of $I_{up}$ may change 10%, and so forth. Also, doubling the pulse current will not cause the voltage rise to double. The battery reactions are not linear.

It is also possible for the pulse test to be performed using different test parameters, e.g., pulse amplitude, pulse duration. Also, an independent means of measuring internal resistance could also be used in place of the above described pulse test. However, as before, a different calibration curve would have to be generated to account for the different means of calculating battery internal resistance. Here, the changes would be minimal, probably affecting only the weight of IR, but there would still be changes.

The battery available energy prediction as described above is not an independent value, but is developed as dependent on the rate of discharge. This means that a lower discharge rate allows for a higher available energy. The algorithm of equation (2) described above, for example, has been developed based on a 2 C, twice the rated capacity, discharge rate. For batteries being discharged at 2 C Amperes, the equation is fairly accurate.

To meet the needs of predicting available energy at differing discharge rates, the available energy value can be adjusted based on the discharge rate. To do this, a table is constructed of available energy vs. discharge current. The values come from one of two procedures: (1) read data points off of the battery manufacturer's specification sheet, or (2) cycle a battery from 100% to 0% SOC repeatedly, but at different discharge rates (e.g., C/10, C/5, C/3, C/2, C, 2 C, 3 C, etc.). The wider the variety of rates, the better. These values are placed in the table vs. the actual discharge capacity achieved on each cycle run.

The above process is preferably repeated on several batteries to confirm the relationship. However, it is important to observe the data within each battery, as the primary goal of the exercise is to see how changes in rates of discharge effect any given battery. Once a relational table is in place from either of the above two methods, a logarithmic regression curve is implemented to approximate the relationship between rate of discharge and discharge rate. The logarithmic estimation is used since the behavior is inherently logarithmic. A battery performance algorithm that compares discharge capacity to discharge current is:

$$\text{New } AE = \text{Old } AE - 1.8 \log (\text{New Disc Rate/Old Disc Rate}) \quad (3)$$

where:

Old=the level at which the algorithm was developed (2 C discharge rate)

New=the new active level that is being determined

AE=available energy

Disc Rate=the discharge rate

All of the above computations can be performed by the computer A and the appropriate display of the results made with all necessary information.

The computed predicted value of battery available energy can also be presented on a display in a Time to Run form, here the time left to run the battery is presented instead of the battery remaining capacity in Ah format. Once the discharge capacity has been adjusted to meet the new discharge rate state, such as by using equation (3), the second step is to convert the Ah form to a time to run form. This is done by dividing the predicted available energy by the discharge current, and converting the result at the time scale desired (seconds, minutes, hours). An equation for this is:

$$\text{Time to Run} = \text{Available energy}/\text{discharge rate} * \text{time unit} \quad (4)$$

If in making the time to run calculation the discharge rate of the application is different from that at which the prediction equation was developed, the adjustment factor must be applied such as by using equation (3). To maintain continual accuracy, the time to run is made to react to changes in the discharge current. Therefore, the two step technique of first adjustment to different discharge rate by using equation (3) and then using the time to run equation (4) must constantly be repeated, to adjust for the remaining available energy. To do this, discharge current is constantly monitored within an infinite loop. The final action of each loop cycle (once current is measured) is used to adjust the remaining time to run to meet the new current draw. All of this is done by the computer A as the acquired data is updated.

In the case of a non-discharge situation, such as a UPS, the UPS load is used as an estimation for discharge current, and the above process uses an estimated conversion of UPS load to determine time to run. This means that the initial predicted available energy must be reduced through monitoring techniques such as coulomb counting. Coulomb counting is achieved by measuring average current into (charge) or out of (discharge) the battery during a loop cycle, multiplied by the cycle period. That recomputed remaining available energy is subjected to the above described two step process to readjust remaining available energy to the discharge current, and then the available energy value converted into a time remaining form.

EXAMPLE

The following is an example of the use of the invention for a 24 V, 18 Ah lead-acid rechargeable battery formed by 4 Panasonic LC-R129P1 cells connected in a series, parallel configuration. The battery was removed from a UPS system and connected to the battery test stand. The battery was subjected to a 1.5A charge pulse. Internal resistance was determined to equal 65.4 Milliohms. The battery was then subjected to the current ramp test. The open circuit voltage of the battery was measured at 25.21 V. Two gas points were detected, one on the rising half of the ramp and one on the decreasing half of the ramp. The Gas Up point occurred at 1.9 A, 21.01 V. The Gas Down point occurred at 0.99A, 27.63 V. The battery case temperature was measured at 24.38° C.

Using these values in the available energy determination formula (2) given above, the available energy is predicted to be:

$$\text{Available energy} = 25.21*1.872 + 24.38*-0.184 + 65.4*-0.062 + 1.9*1.415 + 29.01*-0.485 + 0.99*1.632 + 27.63*0.5498 - 36.13$$

This equals 4.69 Ah for a 2 C rate. The predicted available energy result was confirmed through a full discharge of the battery, performed at a 2 C rate.

Available energy for the battery was converted to Time To Run:

$$\text{Time To Run} = \text{Available energy}/\text{Current}*60 = 7.23 \text{ minutes}$$

To confirm this, the battery was attached to a UPS system using utility power. The power was subsequently removed. With a 75% load applied to the battery the system was allowed to operate until the unit shut itself down at the point of full battery discharge for the appropriate discharge current. Shut down occurred at 7.25 minutes. This was an error of 2 seconds which confirmed the available energy equation.

Specific features of the invention are shown in one or more of the drawings for convenience only, as each feature may be combined with other features in accordance with the invention. Alternative embodiments will be recognized by those skilled in the art and are intended to be included within the scope of the claims.

We claim:

1. A method of predicting the available energy of a battery comprising the steps of:

determining the battery internal resistance (IR);

measuring the battery open circuit voltage (OCV) and temperature (T);

calculating the voltage and current points ($V_{gas}$ and $I_{gas}$) at which the battery transitions from one of a charge to overcharge or overcharge to charge state in response to at least one of battery charge and discharge; and predicting the available energy on the basis of the parameters OCV, T, IR, $V_{gas}$, and $I_{gas}$ by developing an algorithm of prediction of available energy as a function of OCV, T, IR, $V_{gas}$, and $I_{gas}$ and acquiring an applying the values of OCV, T, IR, $V_{ga}$, and $I_{gas}$ of the battery under test to the algorithm.

2. The method of claim 1 wherein the step of calculating the $V_{gas}$ and $I_{gas}$ comprises:

applying to the battery a ramp of current (I) in each of the positive and negative directions;

monitoring the voltage response (V) in response to the applied current;

calculating the slope of the response as dV/dI; and determining the maximum points of the slope.

3. The method of claim 1 wherein the step of developing numerical weighting factors comprises subjecting the data of OCV, T, IR, $V_{up}$, $I_{up}$, $V_{dn}$, and $I_{dn}$ to an analysis to produce a linear equation having a numerical value as a weighting factor associated with each of the parameters.

4. The method of claim 3 wherein the analysis comprises a linear regression and the algorithm produced also includes a numerical setoff value.

5. The method of claim 3 wherein the equation of the algorithm is of the form $$\text{Available energy} = OCV*(a) + T*(b) + IR*(c) + I_{up}*(d) + V_{up}*(e)I_{dn}*(f) + V_{dn}*(g) + (h)$$

where each of (a), (b), (c), (d), e), (f), (g), and (h) is a numerical value.

6. The method of claim 5 wherein for a lead-acid storage battery the algorithm is:

Available energy=$(OCV)*1.872+T*-0.184+IR*-0.062+I_{up}*1.415+V_{up}*0.485+I_{dn}*-1.632+V_{dn}*0.5498-36.13$.

7. The method of claim 3 further comprising the step of acquiring the parameters of OCV, T, IR, $V_{up}$, $I_{up}$, $V_{dn}$, and $I_{dn}$ and developing an algorithm with weighting factors for batteries in each of different ranges of battery Amp-hour rated capacity.

8. The method of claim 1 further comprising the step of determining the Time to un to discharge of a battery under test based on the predicted available energy in accordance with the equation:

Time to Run=Available energy/discharge rate*time unit.

9. The method of claim 8 further comprising repeating the steps of determining the Time to Run over a period of time as current is being drawn from the battery by subtracting the current drawn from the battery between successive Time to Run determinations and using the result of the subtraction in recalculating the available energy for the latter Time to Run determination.

10. A method of predicting the available energy of a battery comprising the steps of:

determining the battery internal resistance (IR);

measuring the battery open circuit voltage (OCV) and temperature (T);

calculating the voltage d current points ($V_{gas}$ and $I_{gas}$) at which the battery transitions from one of a charge to overcharge or overcharge to charge state in response to at least one of battery charge and discharge, said step of calculating comprising applying to the battery a ramp of current (I) in each of the positive and negative directions;

monitoring the voltage response (V) in response to the applied current (I), calculating the slope of the responses as dV/dI, and determining the maximum points ($V_{up}$ and $I_{up}$) of $V_{gas}$ and $I_{gas}$ of the slope on the positive current ramp at the transition from charge to overcharge and the maximum point ($V_{dn}$ and $I_{dn}$) on the negative ramp at the transition from overcharge to charge; and predicting the available energy on the basis of the parameters OCV, T, IR, $V_{up}$, $I_{up}$, $V_{dn}$, and $I_{dn}$ by developing an algorithm comprising the parameters OCT, T, IR, $V_{up}$, $I_{up}$, $V_{dn}$, and $I_{dn}$, developing weighting factors for each of the parameters, acquiring for the battery under test numerical values of each of the parameters, and applying the acquired numerical values of the parameters to the algorithm.

* * * * *